(12) United States Patent
Takahashi et al.

(10) Patent No.: US 9,909,809 B2
(45) Date of Patent: Mar. 6, 2018

(54) HEAT TREATMENT APPARATUS AND METHOD OF CONTROLLING THE SAME

(71) Applicant: TOKYO ELECTRON LIMITED, Tokyo (JP)

(72) Inventors: Goro Takahashi, Oshu (JP); Takanori Saito, Oshu (JP); Wenling Wang, Oshu (JP); Koji Yoshii, Oshu (JP); Tatsuya Yamaguchi, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1060 days.

(21) Appl. No.: 13/742,599

(22) Filed: Jan. 16, 2013

(65) Prior Publication Data

US 2013/0186878 A1 Jul. 25, 2013

(30) Foreign Application Priority Data

Jan. 23, 2012 (JP) .................................. 2012-011203

(51) Int. Cl.
*A21B 1/22* (2006.01)
*H05B 1/02* (2006.01)
(Continued)

(52) U.S. Cl.
CPC .......... *F27D 19/00* (2013.01); *F27B 17/0025* (2013.01); *F27D 21/0014* (2013.01); *H01L 21/67109* (2013.01); *H01L 21/67248* (2013.01)

(58) Field of Classification Search
CPC .......... F24C 14/02; F24C 15/022; F24C 7/08; F24C 7/087; H05B 1/0213; F27D 19/00;
(Continued)

(56) References Cited

U.S. PATENT DOCUMENTS 4,568,866 A * 2/1986 Floro et al. .................... 318/696
4,740,664 A * 4/1988 Payne et al. .............. 219/448.12
(Continued)

FOREIGN PATENT DOCUMENTS

JP 2002334844 11/2002

*Primary Examiner* — David Angwin
*Assistant Examiner* — Gyounghyun Bae
(74) *Attorney, Agent, or Firm* — Cantor Colburn LLP

(57) ABSTRACT

The heat treatment apparatus includes: a processing chamber which accommodates a processing object; a heating unit which heats the processing object accommodated in the processing chamber; a temperature detecting unit which detects an internal temperature of the processing chamber; and a controller which sets a second setting temperature identical to as a temperature detected by the temperature detecting unit when the temperature detected by the temperature detecting unit falls below a predetermined first setting temperature due to an external disturbance; controls the heating unit so that a third setting temperature between the second setting temperature and the first setting temperature becomes identical to the temperature detected by the temperature detecting unit; and controls the heating unit so that the first setting temperature becomes identical to the temperature detected by the temperature detecting unit after the third setting temperature becomes identical to the temperature detected by the temperature detecting unit.

5 Claims, 4 Drawing Sheets

(51) Int. Cl.
  *A21B 1/00* (2006.01)
  *F27D 19/00* (2006.01)
  *F27D 21/00* (2006.01)
  *F27B 17/00* (2006.01)
  *H01L 21/67* (2006.01)

(58) Field of Classification Search
  CPC .......... F27D 21/0014; H01L 21/67109; H01L 21/67248; F27B 17/0025
  USPC ............ 219/413, 385, 438, 441, 442, 444.1, 219/445.1, 446.1, 447.1, 448.11–448.14, 219/448.15, 490, 491, 492, 493, 494, 497, 219/498, 501, 502, 503, 504, 505, 506, 219/507, 508, 509, 510, 511, 512, 513, 219/514, 515, 516, 608, 627, 667, 710, 219/110; 701/36, 41, 42, 44, 46, 68, 69, 701/70, 90, 93–115, 31.1, 33.9; 700/28–85
  See application file for complete search history.

(56) References Cited

U.S. PATENT DOCUMENTS

| | | | |
|---|---|---|---|
| 4,898,230 A * | 2/1990 | Tsuchiyama et al. | 165/265 |
| 5,111,026 A * | 5/1992 | Ma | 219/492 |
| 5,350,900 A * | 9/1994 | Inage et al. | 219/508 |
| 5,465,035 A * | 11/1995 | Scaramuzzo et al. | 318/561 |
| 6,207,937 B1 | 3/2001 | Stoddard et al. | |
| 6,265,696 B1 * | 7/2001 | Sakurai et al. | 219/390 |
| 6,461,438 B1 * | 10/2002 | Ookura et al. | 118/724 |
| 6,470,225 B1 * | 10/2002 | Yutkowitz | 700/44 |
| 6,993,418 B2 * | 1/2006 | Stewart | 700/299 |
| 7,324,877 B2 * | 1/2008 | Tanaka et al. | 700/300 |
| 7,444,572 B2 * | 10/2008 | Kaushal et al. | 714/733 |
| 2003/0031905 A1 * | 2/2003 | Saito et al. | 429/26 |
| 2003/0057914 A1 * | 3/2003 | Kamatsu et al. | 318/727 |
| 2003/0121905 A1 * | 7/2003 | Nanno et al. | 219/494 |
| 2005/0026460 A1 | 2/2005 | Hornberg et al. | |
| 2006/0241891 A1 * | 10/2006 | Kaushal | H01L 21/67248 702/136 |
| 2007/0018599 A1 * | 1/2007 | Yamamoto et al. | 318/439 |
| 2008/0255683 A1 * | 10/2008 | Takahashi et al. | 700/42 |
| 2009/0095422 A1 * | 4/2009 | Sugishita | C23C 16/4411 156/345.27 |
| 2009/0112506 A1 * | 4/2009 | Kazama | 702/130 |
| 2010/0124726 A1 * | 5/2010 | Sugishita et al. | 432/36 |
| 2010/0264126 A1 * | 10/2010 | Baek et al. | 219/412 |
| 2011/0054845 A1 * | 3/2011 | Han et al. | 702/185 |
| 2011/0160921 A1 * | 6/2011 | Petit et al. | 700/285 |
| 2013/0186878 A1 * | 7/2013 | Takahashi et al. | 219/413 |

* cited by examiner

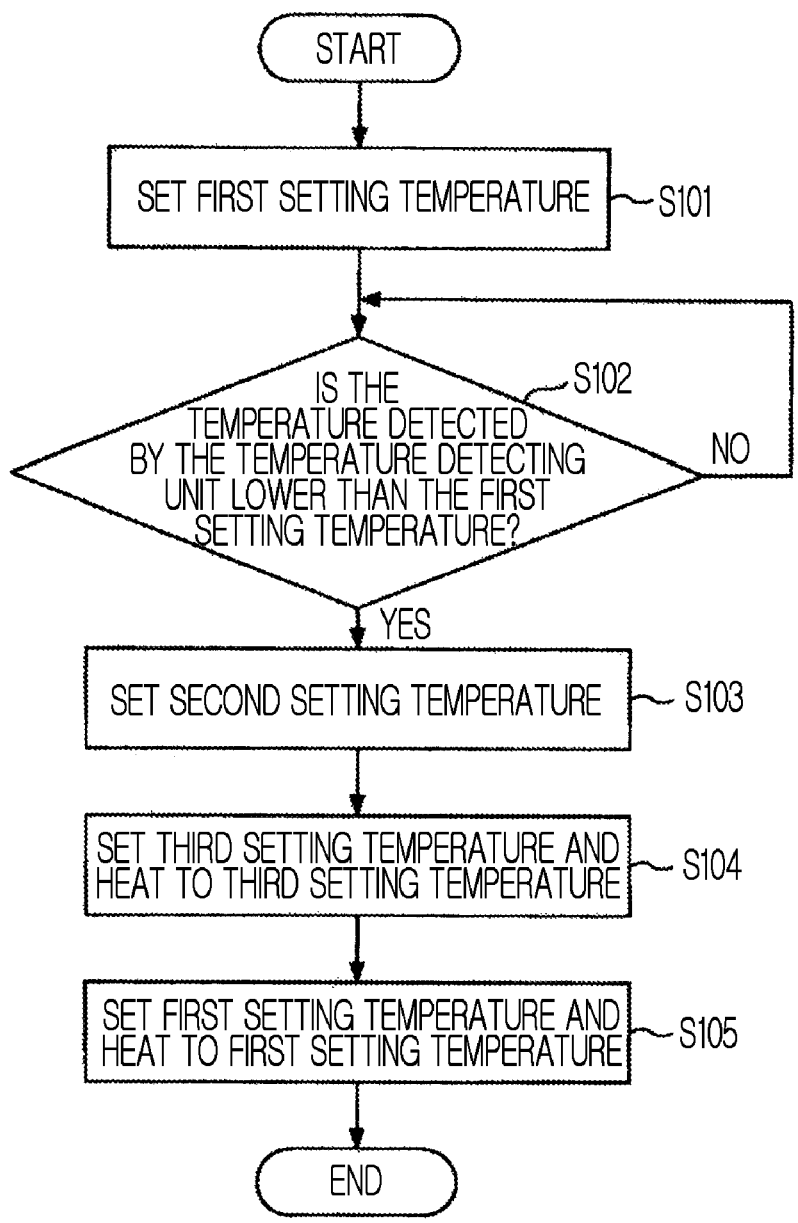

HEAT TREATMENT APPARATUS AND METHOD OF CONTROLLING THE SAME

CROSS-REFERENCE TO RELATED PATENT APPLICATIONS

This application claims the benefit of Japanese Patent Application No. 2012-011203, filed on Jan. 23, 2012, in the Japan Patent Office, the disclosure of which is incorporated herein in its entirety by reference.

BACKGROUND OF THE INVENTION

1. Field of the Invention

The present invention relates to a heat treatment apparatus and a method of controlling the same.

2. Description of the Related Art

In general, a vertical type heat treatment apparatus and a horizontal type heat treatment apparatus are known as apparatuses for performing a heat treatment, such as a film formation process, an oxidation process, and a diffusion process, on a semiconductor wafer. Among the apparatuses, the vertical type heat treatment apparatus is used mainly because the vertical type heat treatment apparatus generates less engulfment of air (for example, Patent Reference 1).

In these heat treatment apparatuses, in general, when a setting temperature or a ramping rate is changed, a ramping beginning temperature starts at a previous target temperature.

In a conventional heat treatment apparatus, when an actual temperature temporarily falls due to an external disturbance that occurs, for example, when a wafer boat is carried into the heat treatment apparatus, a large difference occurs between a target temperature and the actual temperature, and thus an output of the heat treatment apparatus increases. Thus, the actual temperature is overshot, and accordingly, it takes a long time to return an internal temperature of the heat treatment apparatus and a temperature of a semiconductor wafer to target temperatures.

PRIOR ART REFERENCE (Patent Reference 1) Japanese Laid-Open Patent Publication No. 2002-334844

SUMMARY OF THE INVENTION

According to an aspect of the present invention, a processing chamber which accommodates a processing object; a heating unit which heats the processing object accommodated in the processing chamber; a temperature detecting unit which detects an internal temperature of the processing chamber; and a controller which sets a second setting temperature that is the same as a temperature detected by the temperature detecting unit when the temperature detected by the temperature detecting unit falls below a predetermined first setting temperature due to an external disturbance; controls the heating unit so that the temperature detected by the temperature detecting unit becomes identical to a third setting temperature between the second setting temperature and the first setting temperature; and controls the heating unit so that the temperature detected by the temperature detecting unit becomes identical to the first setting temperature after the temperature detected by the temperature detecting unit becomes identical to the third setting temperature.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a flowchart showing the method of FIG. 2B.

DETAILED DESCRIPTION OF THE INVENTION

Figure 1:
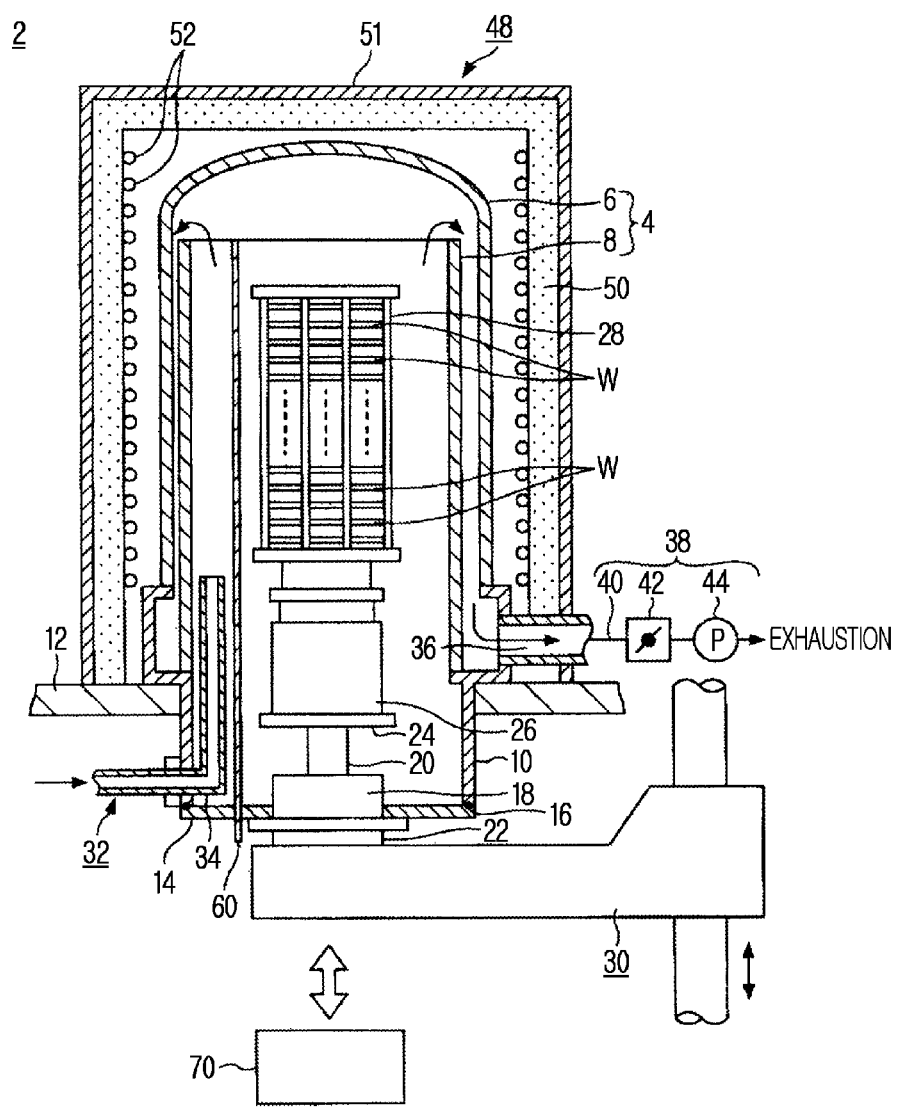
FIG. 1 is a schematic view showing a configuration of a heat treatment apparatus, according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, the present invention will be described in detail by explaining exemplary embodiments of the invention with reference to the attached drawings.

Heat Treatment Apparatus

First, a configuration of a heat treatment apparatus according to an embodiment of the present invention will now be described. FIG. 1 is a schematic view showing a configuration of the heat treatment apparatus. However, the present invention is not limited to the configuration of the heat treatment apparatus 2 shown in FIG. 1. The present invention may be applied to any heat treatment apparatus including a processing chamber for processing a substrate, a heating unit for heating a processing object accommodated in the processing chamber, a temperature detecting unit for detecting a temperature of the processing chamber, and a controller for controlling the heating unit, and capable of performing a heat treatment method to be described later. Although FIG. 1 shows the heat treatment apparatus 2 that processes a semiconductor wafer W (hereinafter, referred to as a wafer W) as the processing object, the present invention is not limited thereto.

As shown in FIG. 1, the heat treatment apparatus 2 includes a processing container 4 that has a cylindrical shape and is vertically disposed in a lengthwise direction thereof. The processing container 4 includes an outer cylinder 6 and an internal cylinder 8 (corresponding to a processing chamber in the claims of the present invention) that is concentrically disposed inside the outer cylinder 6, wherein the processing container 4 is configured as a double-chamber.

The outer cylinder 6 and the internal cylinder 8 are formed of a heat-resistant material, for example, quartz. Lower end portions of the outer cylinder 6 and the internal cylinder 8 are supported by a manifold 10 that is formed of, for example, stainless steel. Also, the manifold 10 is fixed to a base plate 12.

A cap portion 14 having a disc shape and formed of, for example, stainless steel is airtightly attached to an opening portion at a lower end portion of the manifold 10 by seal member 16, for example O-ring, or the like. Also, a rotating shaft 20 is inserted at an approximate center portion of the cap portion 14, and the rotating shaft 20 may be rotated by, for example, a magnetic fluid seal 18, in an airtight state. A lower end of the rotating shaft 20 is connected to a rotating mechanism 22, and a table 24 formed of, e.g., stainless steel, is fixed to an upper end of the rotating shaft 20.

A thermos vessel 26 formed of, e.g., quartz, is provided on the table 24. Also, a wafer boat 28 formed of, e.g., quartz, is mounted as a support on the thermos vessel 26. The wafer boat 28 accommodates a plurality of wafers W, for example, 50 to 150 wafers W, as processing objects, at a predetermined interval, for example, at a pitch of about 10 mm. The wafer boat 28, the thermos vessel 26, the table 24, and the cap portion 14 are integrally loaded into or unloaded in the processing container 4 by, for example, an elevation mechanism 30, which is a boat elevator.

A gas introduction unit 32 for introducing gas into the processing container 4 is provided in a lower portion of the manifold 10. The gas introduction unit 32 includes a gas nozzle 34 that airtightly penetrates the manifold 10.

In general, a flow rate of gas introduced into the processing container 4 through the gas nozzle 34 is controlled by a flow rate control mechanism (not shown). Also, although only one gas nozzle 34 is shown in FIG. 1, a plurality of the gas nozzles 34 may be provided according to the types of gases to be used.

A gas outlet 36 is provided in an upper portion of the manifold 10, and an exhaust system 38 is connected to the gas outlet 36. The exhaust system 38 includes an exhaust passage 40 that is connected to the gas outlet 36, and a pressure control valve 42 and a vacuum pump 44 that are sequentially connected in the middle of the exhaust passage 40. The exhaust system 38 may exhaust the processing container 4 while controlling pressure of the atmosphere inside the processing container 4.

Alternatively, the processing container 4 may be entirely formed of, for example, quartz, without providing the manifold 10.

A heating apparatus 48 for heating the processing object, e.g. the wafer W, is provided at an outer circumference of the processing container 4 to surround the processing container 4. The heating apparatus 48 includes a heat-insulating layer 50 with a ceiling and formed in a cylindrical shape. The heat-insulating layer 50 is formed of, for example, a mixture of silica and alumina oxide that have a low thermal conductivity and are soft and amorphous. In general, the heat-insulating layer 50 has a thickness of about 30 to 40 mm. Also, an inner surface of the heat-insulating layer 50 is spaced apart from an outer surface of the processing container 4 by a predetermined distance. In addition, a protection cover 51 that is formed of, e.g., stainless steel is attached to an outer circumferential surface of the heat-insulating layer 50 to entirely cover the heat-insulating layer 50.

A heating element 52 (corresponding to a heating unit in the claims of the present invention) is disposed at an inner circumference of the heat-insulating layer 50 by being spirally wound. The heating element 52 is wound around, for example, an entire side surface of the heat-insulating layer 50 and to cover the overall height of the processing container 4. In other words, the heat-insulating layer 50 is provided at the outer circumference of the heating element 52.

Also, a thermocouple 60 (corresponding to a temperature detecting unit in the claims of the present invention) is inserted into the internal cylinder 8 to measure a temperature of the internal cylinder 8, that is, a temperature of the wafer W.

The heating element 52 and the thermocouple 60 are divided into one or more zones in a height direction (In FIG. 1, the heating element 52 and the thermocouple 60 are not divided into zones for convenience of description). The heating element 52 and the thermocouple 60 are configured in such a way that a temperature of each zone of the heating element 52 and the thermocouple 60 may be independently and separately controlled by a controller 70. Also, when the heating element 52 and the thermocouple 60 are divided into a plurality of zones in the height direction, one controller 70 may control the temperatures of the zones or a controller is prepared for each zone to control the temperature of the zone. If a plurality of controllers are prepared to control the temperatures of the respective zones (according to the number of zones), each controller may be configured to perform a method of controlling the heat treatment apparatus 2, which will be described later.

The controller 70 includes, for example, an operation processing unit, a memory unit, and a display unit that are not shown in FIG. 1. The operation processing unit may be, for example, a computer including a central processing unit (CPU). The memory unit may be a computer-readable recording medium that is configured by, for example, a hard disk on which a program for executing various processes by the operation processing unit. The display unit is configured by, for example, a computer screen. The operation processing unit reads a program recorded in the memory unit and controls the heating unit according to the program.

Method of Controlling Heat Treatment Apparatus

Figure 2A:
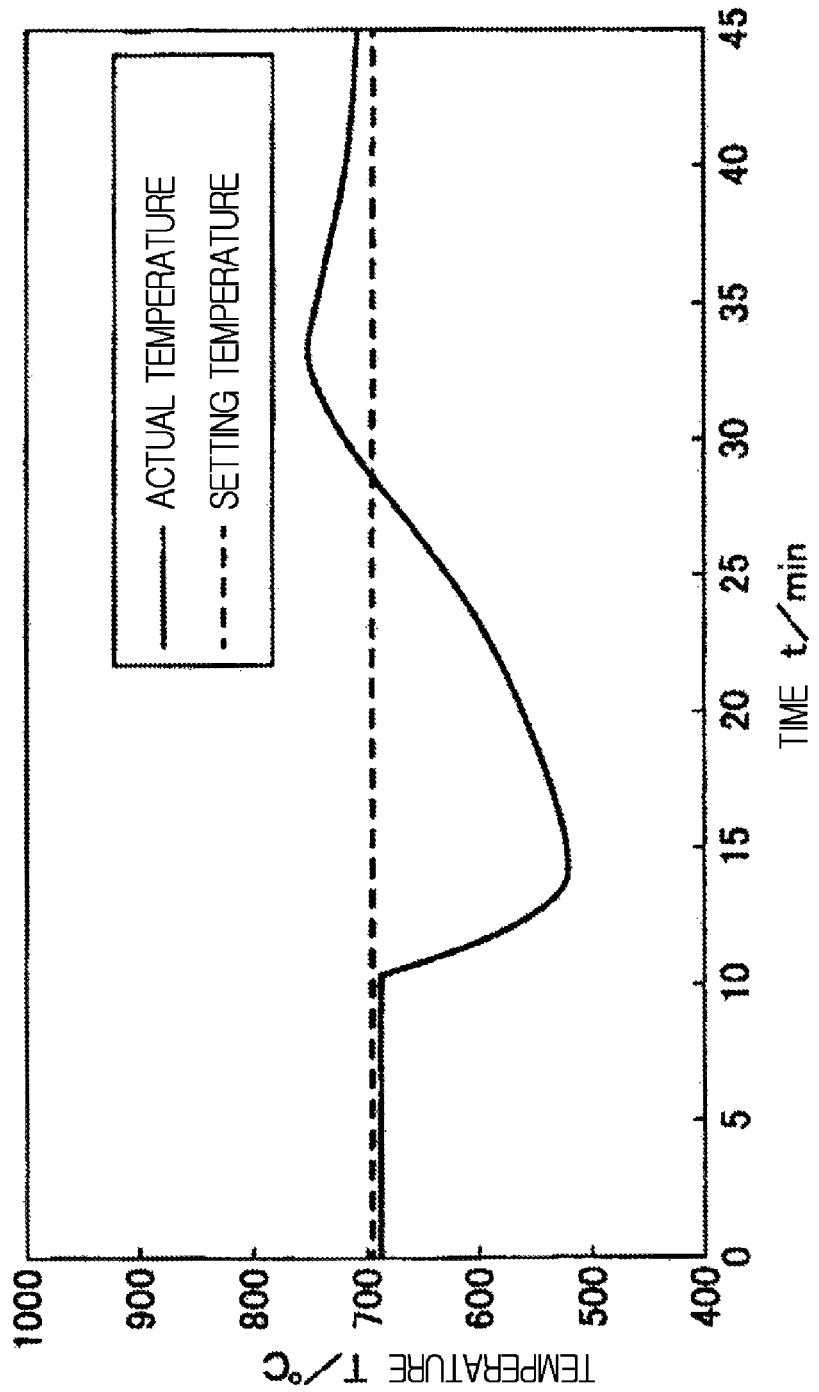
FIGS. 2A and 2B are respectively schematic graphs for describing a conventional method of controlling a heat treatment apparatus and a method of controlling a heat treatment apparatus according to an embodiment of the present invention.
Figure 2B:
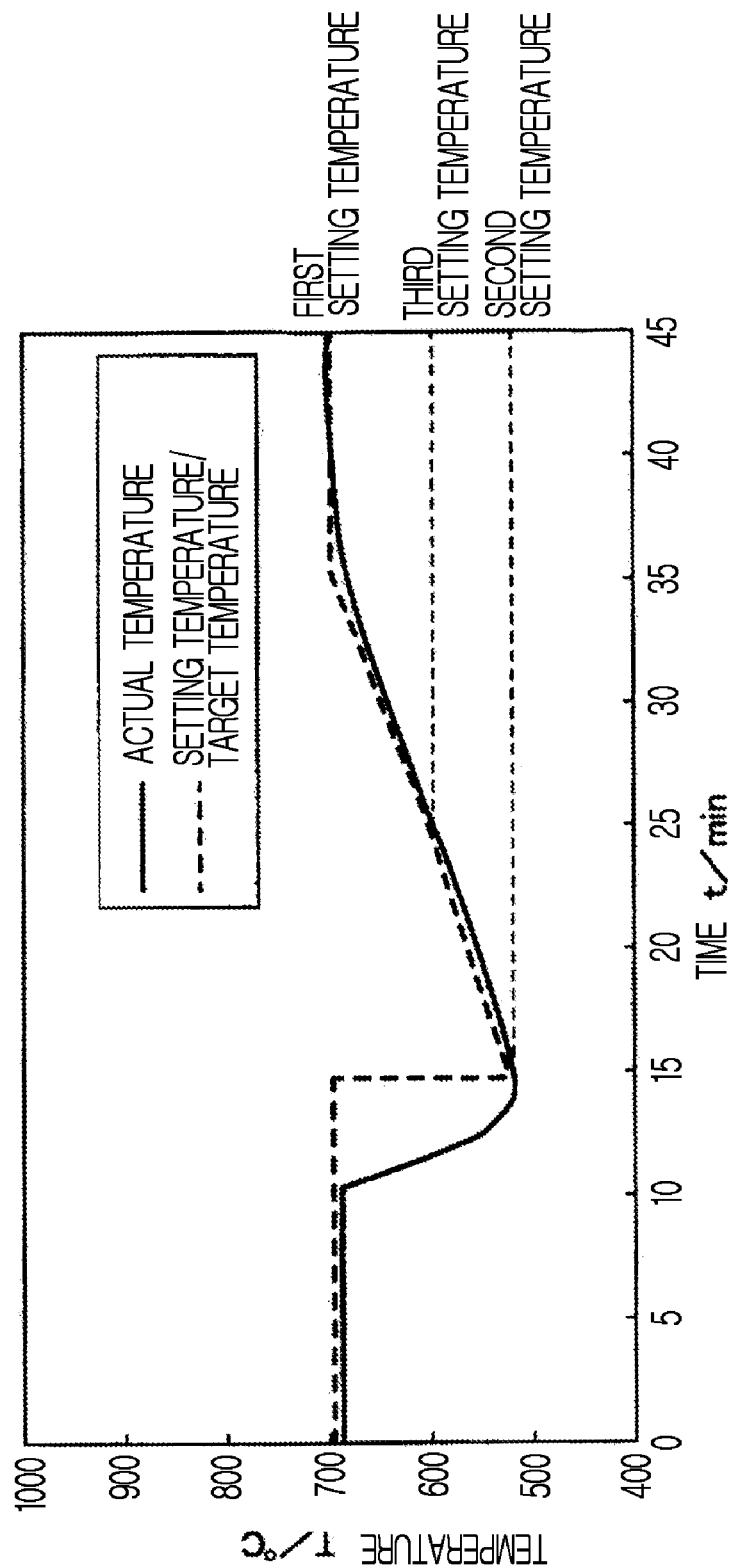

Next, methods of controlling the heat treatment apparatus 2 shown in FIG. 1 will be described with reference to FIGS. 2A and 2B. FIG. 2A is a graph for describing a conventional method of controlling a heat treatment apparatus. In FIG. 2A, a vertical axis indicates a temperature of the heat treatment apparatus, and a horizontal axis indicates time. Also, in FIG. 2A, a solid line indicates a temperature (hereinafter, referred to as an actual temperature) of the heat treatment apparatus (that is, in the internal cylinder 8) that is detected by, for example, the thermocouple 60 shown in FIG. 1, and a dashed line indicates a setting temperature (corresponding to a first setting temperature in the claims of the present invention) of the heat treatment apparatus. In FIGS. 2A and 2B, although an example of controlling a temperature of the heat treatment apparatus is described in which the temperature of the heat treatment apparatus is previously set to 700° C. and the temperature of the heat treatment apparatus is decreased to less than 700° C. due to an external disturbance, the present invention is not limited thereto.

As shown in FIG. 2A, in the conventional method of controlling the heat treatment apparatus, if an external disturbance occurs, the actual temperature begins to fall with respect to the setting temperature. If the actual temperature falls below the setting temperature, a large power is supplied to a heater to return the actual temperature to the setting temperature, and thus an amount of heat generated by the heater is increased later than the falling of the temperature in the heat treatment apparatus, thereby overshooting the actual temperature. If the actual temperature is overshot, it takes a long time for the temperature in the heat treatment apparatus to be stabilized to a target temperature, thereby reducing a throughput.

Also, the external disturbance refers to factors that make the actual temperature lower than the setting temperature in the heat treatment apparatus. Specifically, the external disturbance may refer to a case where, referring to FIG. 1, the wafers W held by the wafer boat 28 are loaded into (or unloaded from) the processing container 4 by the elevation mechanism 30, or the external disturbance may refer to, for example, changes in process conditions. The changes in process conditions may include, for example, a case where the actual temperature is decreased due to the gas introduced into the processing container 4 by the gas introduction unit 32 via the gas nozzle 34 or a case where the actual temperature is decreased according to a change in pressure inside the processing container 4 occurring due to exhaust of the gas.

FIG. 2B is a graph for describing a method of controlling the heat treatment apparatus, according to an embodiment of the present invention. In FIG. 2B, a vertical axis indicates a temperature of the heat treatment apparatus, and a horizontal axis indicates time. Also, in FIG. 2B, a solid line indicates an actual temperature of the heat treatment apparatus, and a dashed line indicates a setting temperature or a target temperature of the heat treatment apparatus. Also, FIG. 3 is a flowchart showing a method of controlling the heat treatment apparatus, according to an embodiment of the present invention.

As shown in FIG. 2B, in the method of controlling the heat treatment apparatus, according to an embodiment of the present invention, the actual temperature of the heat treatment apparatus 2 is compared with a predetermined setting temperature (operation S101), and then, if the actual temperature of the heat treatment apparatus is decreased due to an external disturbance (operation S102: Yes), the controller sets the setting temperature to the same temperature as the actual temperature (corresponding to a second setting temperature in the claims of the present invention) (operation S103).

A standard of determination for changing the first setting temperature to the second setting temperature is not particularly restricted if it is after the actual temperature is decreased with respect to the setting temperature due to an external disturbance. A preferred standard of determination may vary according to factors of the external disturbance. For example, the second setting temperature is set when a change rate of the actual temperature with respect to time exceeds a predetermined threshold value; when time at which the actual temperature continuously falls below the first setting temperature exceeds a predetermined threshold value; when a difference between the actual temperature and the first setting temperature exceeds a predetermined threshold value; or by combining the above-described determination standards, but the present invention is not limited thereto.

After the setting temperature is changed from the first setting temperature to the second setting temperature, the controller sets a third setting temperature between the first setting temperature and the second setting temperature, and controls the heater (corresponding to a heating unit in the claims of the present invention) so that the third setting temperature and the actual temperature become identical to each other (operation S104).

If the third setting temperature is set between the first setting temperature and the second setting temperature, the third setting temperature is not particularly limited. For example, the third setting temperature may be a middle temperature between the first setting temperature and the second setting temperature, may be a temperature that divides a temperature range between the first setting temperature and the second setting temperature at a ratio of x:y, where x and y are independent natural numbers, except for a case where x and y are identical to each other, or may be a temperature lower than the first setting temperature by a predetermined threshold value when a difference between the actual temperature and the first setting temperature exceeds the predetermined threshold value.

Although a method of controlling the heater so that the actual temperature becomes identical to the third setting temperature is not particularly limited, the heater may be controlled generally by changing a ramping rate. In this case, the ramping rate may be set to a predetermined value, for example, 2° C./min, 10° C./min, or the like. Alternatively, the ramping rate may be set by using the third setting temperature (or the first setting temperature and the predetermined threshold value), the actual temperature, and the predetermined time so that a time for recovering the third setting temperature from the second setting temperature becomes a predetermined time, for example, 10 min.

After the actual temperature becomes identical to the third setting temperature, the controller resets the first setting temperature and controls the heater so that the actual temperature becomes identical to the first setting temperature (operations S105).

Although a method of controlling the heater so that the actual temperature becomes identical to the first setting temperature is not particularly limited, the heater may be controlled generally by changing a ramping rate, as described above. In this case, the ramping rate may be set to a predetermined value, for example, 2° C./min, 10° C./min, or the like. Alternatively, the ramping rate may be set by using the first setting temperature, the actual temperature, and the predetermined time so that a time for recovering the first setting temperature from the third setting temperature becomes a predetermined time, for example, 10 min.

In the present invention, an example of setting the second setting temperature and then setting the third setting temperature between the first setting temperature and the second setting temperature to rapidly recover the first setting temperature from the decreased temperature without overshoot (or restricting overshoot) when a temperature of the heat treatment apparatus falls below the first setting temperature due to an external disturbance has been described. However, the present invention is not limited thereto, and thus the method of controlling the heat treatment apparatus, according to an embodiment of the present invention, may be performed according to a multistep process including setting the third setting temperature between the first setting temperature and the second setting temperature and controlling the heating unit so that the actual temperature becomes identical to the third setting temperature, setting a fourth setting temperature (furthermore, a n-th setting temperature, where n is a natural number equal to or greater than 5) between the third setting temperature and the first setting temperature and controlling the heating unit so that the actual temperature becomes identical to the fourth setting temperature, and then recovering the actual temperature to the first setting temperature.

Also, in an embodiment where the controller includes a memory unit, the memory unit may store the above-described method of controlling the heat treatment apparatus according to process conditions or a loading speed of the wafer W. Accordingly, when the same method of controlling the heat treatment apparatus 2 is used or expectancy thereof is high, and/or when the loading speed of the wafer W held by the wafer boat 28 is the same or expectancy thereof is high, the previous control method stored in the memory unit may be read out and performed.

According to the present invention, in a heat treatment apparatus including a processing chamber for processing a substrate, a heating unit for heating a processing object accommodated in the processing chamber, a temperature detecting unit for detecting a temperature in the processing chamber, and a controller for controlling the heating unit so that a predetermined setting temperature becomes identical to the temperature detected by the temperature detecting unit, the heat treatment apparatus may be controlled by setting a second setting temperature that is the same as a temperature detected by the temperature detecting unit when the temperature detected by the temperature detecting unit falls below a predetermined first setting temperature due to an external disturbance, controlling the heating unit so that a third setting temperature between the second setting temperature and the first setting temperature becomes identical to the temperature detected by the temperature detecting unit, and controlling the heating unit so that the first setting temperature becomes identical to the temperature detected by the temperature detecting unit after the third setting temperature becomes identical to the temperature detected by the temperature detecting unit. Accordingly, even when an internal temperature of the heat treatment apparatus is decreased due to an external disturbance, a significant increase in the output of the heat treatment apparatus may be prevented, and thus overshoot may be prevented (or removed). Thus, the internal temperature of the heat treatment apparatus may be automatically and rapidly recovered.

According to a heat treatment apparatus of the present invention, the heat treatment apparatus may rapidly recover the internal temperature of the heat treatment apparatus when the internal temperature of the heat treatment apparatus is changed due to an external disturbance.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A heat treatment apparatus comprising:
   a processing chamber which accommodates a processing object;
   a heating unit which heats the processing object accommodated in the processing chamber;
   a temperature detecting unit which detects an internal temperature of the processing chamber; and
   a controller which is configured to: set a second setting temperature that is the same as a temperature detected by the temperature detecting unit when the temperature detected by the temperature detecting unit falls below a predetermined first setting temperature due to an external disturbance; control the heating unit so that the temperature detected by the temperature detecting unit becomes identical to a third setting temperature between the second setting temperature and the first setting temperature; and control the heating unit so that the temperature detected by the temperature detecting unit becomes identical to the first setting temperature after the temperature detected by the temperature detecting unit becomes identical to the third setting temperature.

2. The heat treatment apparatus of claim 1, wherein the controller is configured to set the second setting temperature when a change rate of the temperature detected by the temperature detecting unit with respect to time exceeds a predetermined threshold value as the temperature detected by the temperature detecting unit falls below the predetermined first setting temperature due to the external disturbance.

3. The heat treatment apparatus of claim 1, wherein the controller is configured to set the second setting temperature when a time at which the temperature detected by the temperature detecting unit continuously fails below the first setting temperature due to the external disturbance exceeds a predetermined threshold value as the temperature detected by the temperature detecting unit fails below the predetermined first setting temperature due to the external disturbance.

4. The heat treatment apparatus of claim 1, wherein the controller is configured to set the second setting temperature when a difference between the temperature detected by the temperature detecting unit and the first setting temperature exceeds a predetermined threshold value as the temperature detected by the temperature detecting unit falls below the predetermined first setting temperature due to the external disturbance.

5. The heat treatment apparatus of claim 1, wherein the controller is configured to control the heating unit to change a ramping rate for heating the processing object.

* * * * *